United States Patent [19]

Strom et al.

[11] 4,289,364

[45] Sep. 15, 1981

[54] PLASMA DISPLAY PANEL FLEXIBLE CIRCUIT CONNECTION

[75] Inventors: Richard A. Strom, Eagan; Clark Bergman, St. Paul; Paul F. Michalek, Bloomington, all of Minn.

[73] Assignee: Control Data Corporation, Minneapolis, Minn.

[21] Appl. No.: 87,134

[22] Filed: Oct. 22, 1979

[51] Int. Cl.³ .................... H01J 61/36; H01R 13/635
[52] U.S. Cl. ............................ 339/17 CF; 313/217; 339/74 R; 339/17 F
[58] Field of Search .......................... 313/51, 217, 220; 339/17 R, 176 MR, 75 M, 74 R; 174/68.5, 52 MP

[56] References Cited

U.S. PATENT DOCUMENTS

| | | | |
|---|---|---|---|
| 2,703,854 | 3/1955 | Eisler | 339/17 F X |
| 3,499,167 | 3/1970 | Baker et al. | 315/169 |
| 3,571,489 | 3/1971 | Coale | 174/68.5 |
| 3,631,530 | 12/1971 | Ogle | 313/220 |
| 3,683,222 | 8/1972 | Caras | 313/220 X |
| 3,828,215 | 8/1974 | Bilsback | 313/51 X |
| 4,019,798 | 4/1977 | Zielinski | 339/17 F |

Primary Examiner—Eugene F. Desmond
Attorney, Agent, or Firm—William J. McGinnis, Jr.; Joseph A. Genovese

[57] ABSTRACT

This is a system for connecting flexible electrical connectors having raised conductors above an insulating substrate to a plasma display panel having a glass substrate with the electrical conductors deposited in the bottom surface of conductor pathways etched in a glass substrate. The raised conductors on the connectors mate with the depressed conductors in the panel substrate. The spacing of the conductors in the connector may be varied to facilitate an exact mating with the conductors in the panel substrate. A clip device in combination with a flexible insulating force spreading member applies a uniform continuous pressure to the connector cable and glass substrate combination to maintain connection. This system may be used to facilitate the direct attachment of large scale integrated circuit chip carriers having conductor members on a surface thereof directly to conductors in a plasma display panel substrate.

4 Claims, 8 Drawing Figures

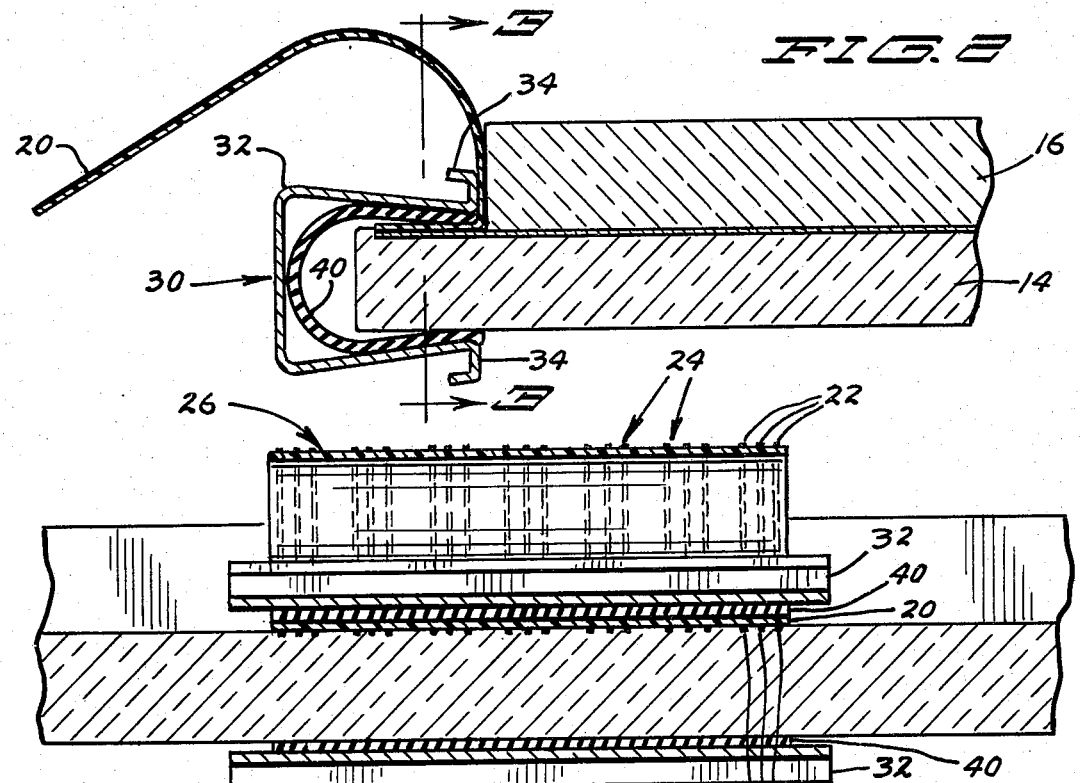
FIG. 2
FIG. 3
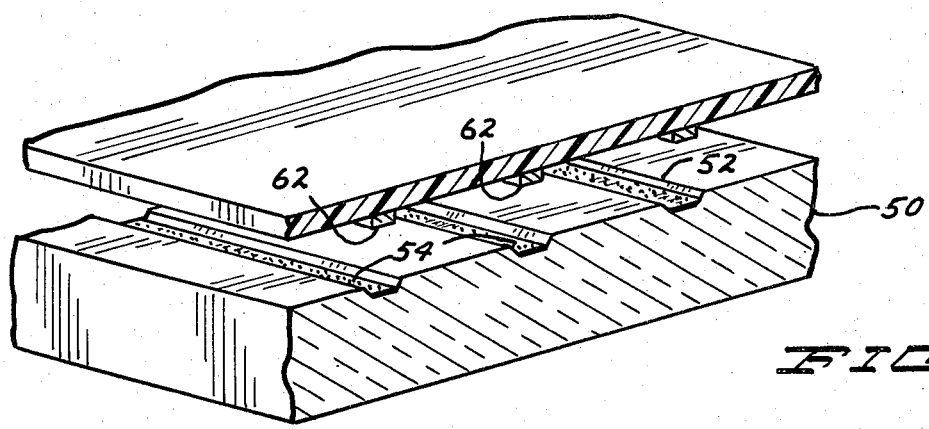
FIG. 4
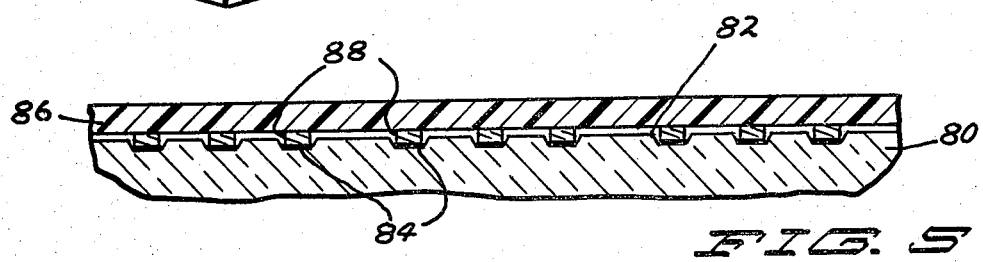
FIG. 5
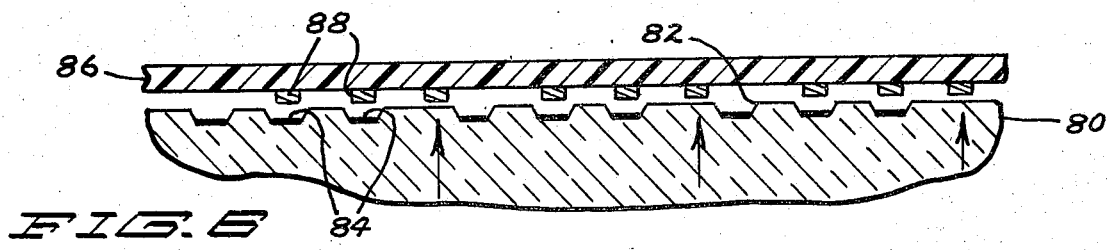
FIG. 6

PLASMA DISPLAY PANEL FLEXIBLE CIRCUIT CONNECTION

BACKGROUND OF THE INVENTION

This invention relates to a system for connecting electrical conductors to plasma display panels. In one aspect of the invention, flexible electrical connectors are connected to a plasma display panel in a mating arrangement which allows for the conductors to be keyed to the panel to provide for an exact conductor-to-conductor alignment. In another aspect of the invention, a large scale integrated circuit chip carrier may be secured directly to a plasma display panel in a semi-permanent attachment using a clip device.

The plasma display panel device, once it is fabricated, is a complex unit requiring some care in handling. For example, it is undesirable after fabrication to have to heat the panel for soldering of electrical connections since localized heating may cause breakage. Also, since the plasma display panel is a permanent structure using glass materials, it is desirable to provide the means for semi-permanently connecting electrical conductors to the panel in a way which allows for disconnection of the conductors, should it be necessary.

The prior art shows U.S. Pat. No. 4,019,798 showing a flexible member connection method to a plasma display panel glass substrate using a clipping device. However, the invention shown in that Patent has the disadvantage that it shows raised conductors on a plasma display panel being connected with raised conductors on the flexible conductor connection means. Thus, conductors on both the panel and the connector appear as raised bumps and it is difficult to maintain a secure contact and proper conductor alignment for such conductors tend to slide away from one another.

Thus, an objective of the present invention is to provide a flexible electrical conductor means for connection to the plasma display panel glass substrate which allows for secure and firm alignment of individual conductors in the panel and on the conductor medium.

SUMMARY OF THE INVENTION

The present invention shows a flexible conductor medium or another conductor system, such as on a large scale integrated circuit chip, having raised conductor elements in a system for mating with a plasma display panel substrate having conductors deposited in conductor pathways etched in the panel substrate at the connection area. Thus, the raised conductors on the element to be connected mate into the etched pathways in the display panel substrate. These conductors may be arranged in a system allowing for exact, keyed connection so that no misalignment or mismating of conductors occurs. This invention has the advantages that with a keyed pattern of conductors, the conductor system is self-aligned and does not require the exact scrutiny required to maintain the alignment of a uniform conductor pattern where the conductors of both the display panel substrate and the conductor medium are raised. This system also has the advantage that no solder technique or heating is required in association with the plasma display panel thus protecting the display panel from the thermal shock associated with soldering directly to a panel. This invention has the further advantage that the pressed contacts on the display panel substrate are unlikely to be damaged by ordinary handling, packing and assembly techniques which such panels must withstand. Thus, contact with the panel is not going to break or disturb the conductor pattern since the conductors lie below the plane of the outer glass surface.

IN THE FIGURES

FIG. 1 is a top plan view of a plasma display panel employing the connection system of the present invention, FIG. 2 is a cutaway cross-sectional view of the plasma display panel of FIG. 1 along the lines 2—2 of FIG. 1, FIG. 3 is a front cross-sectional view of the plasma display panel of FIG. 2 along the lines 3—3 shown in FIG. 2, FIG. 4 is a perspective view of a portion of a plasma display panel mating with a conductor system according to the present invention, FIG. 5 shows a properly aligned conductor system according to the present invention together with a plasma display panel substrate, FIG. 6 shows an improper alignment of a conductor system with a plasma display panel substrate, FIG. 7 shows a top plan view of a large scale integrated circuit chip carrier providing a conductor system for mating with a plasma display panel according to the present invention, and FIG. 8 is a cross-sectional view along lines 8—8 of FIG. 7 according to the present invention.

DESCRIPTION OF THE PREFERRED EMBODIMENTS

Figure 1:
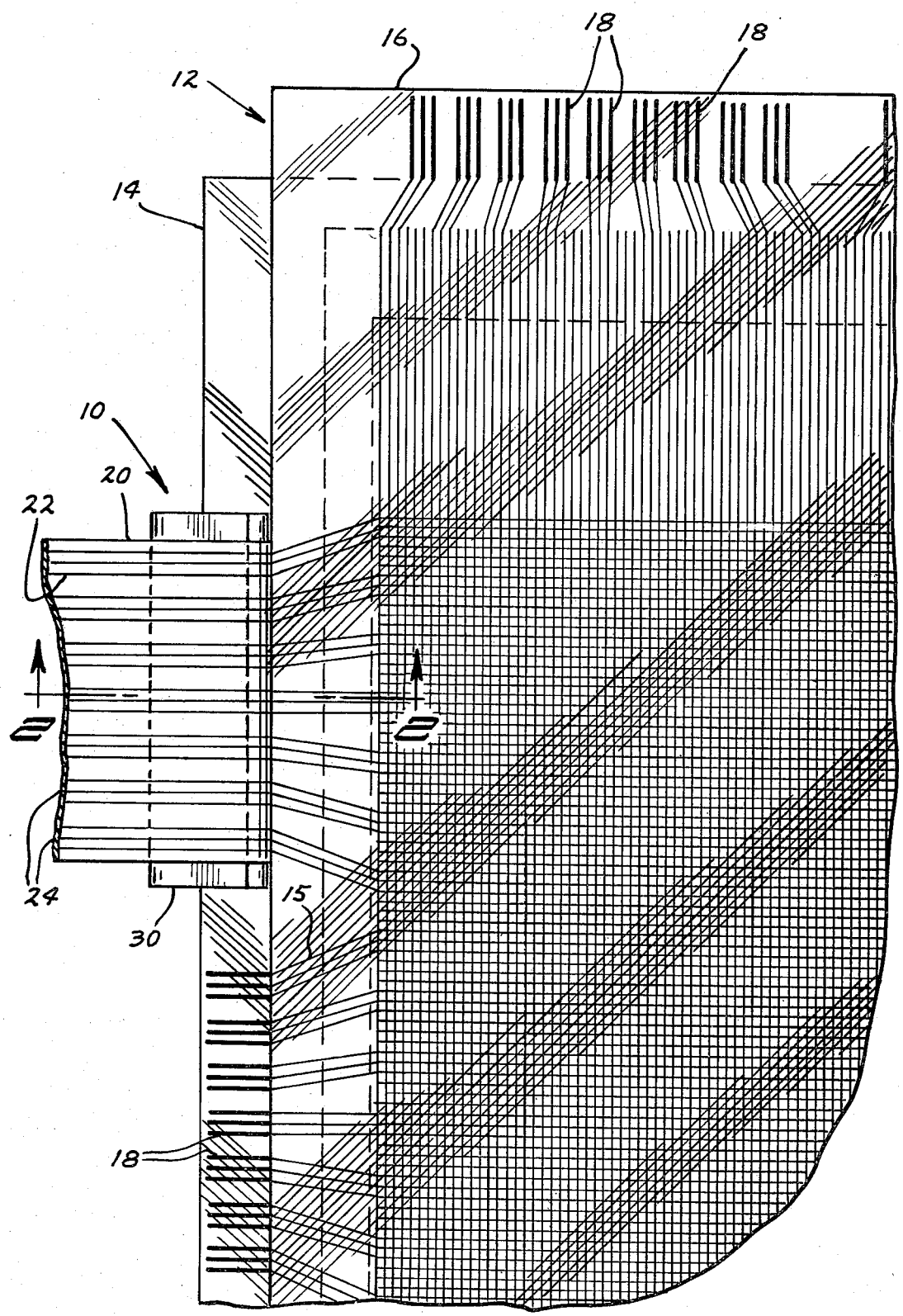

Referring now to FIG. 1, a system 10 according to the present invention, is shown. As may also be seen in FIGS. 2 and 3 a plasma display panel 12 consists of a bottom substrate 14 and a top substrate 16. The substrates 14 and 16 of a plasma display panel each contain an etched pattern of grooves or conductor pathways 18 having a conductor medium deposited in the bottom thereof. These patterns of conductor pathways are all parallel in the display areas of the individual substrates 14 and 16 and the substrates 14 and 16 are mated facing each other so that the respective conductor patterns can form orthogonal patterns having defined intersections for plasma display panel elements as is well known in the plasma display panel art. As is also known in the art, these substrates are sealed together leaving a certain defined space in between to contain the gaseous medium for display panel operation and the two substrates are sealed together in a way which need not be explained here.

As shown in FIGS. 1, 2 and 3, a flexible member conductor device 20, which may be of Kapton or Mylar or any other suitable medium, contains the conductors required to operate the display panel. Generic names for suitable media are polymide and polyester. The device 20 has a plurality of individual conductors 22 contained thereon. These conductors may merely be deposited or etched by known means on the surface of the device 20 and left exposed or a further suitable layer of insulation may be provided. As shown in the Figures, to provide the keying effect of the present invention, the conductors may be spaced in groups 24 which, for illustrative purposes only, is shown as groups of 3 in the Figures. These groups may be of any desired number such as 8 or 16 and the intergroup spacing defined by reference numeral 26 may be of the same amount between each group of conductors or it may be a varying amount to define any degree of keying protection desired. The pattern of conductors in the plasma display panel generally is uniform as shown systematically in FIG. 1. However, it is typical to lead alternate groups of conductors to opposite edges of the same substrate so that not all of the conductors terminate at a single edge of each panel substrate. This may be referred to as interdigitating. A lower contact density results with greater conductor spacing. This allows for different groupings and arrangements of conductors. A clip member 30 is provided, as best seen in FIG. 2, to clamp the conductor member 20 into mating relationship with the etched grooves in the panel substrate. The clip member 30 is comprised of a U-shaped portion 32 having at either termination end a flange 34 which allows the jaws of a spreading type tool to engage the clip member 30 and spread the clip member apart for removal or application to a conductor connection area. As shown in the front cross-sectional view, FIG. 3, the conductor members in the panel 18 appear as depressions in mating engagement with conductor elements on the conductor member 20.

The conductor pattern etched in the display panel may be of metals such as gold, silver, nickel, platinum, aluminum or copper while the conductor members in the conductor medium 20 may be of metals such as aluminum, silver, gold or copper to allow for a secure mating engagement of the cable and the conductor surface in the panel. It is clear that almost any combination of conductive materials will work as long as the junction combination of materials is conductively stable in the operating environment.

The clip member 30 has within it a force dispersing member 40 which helps spread the contact engaging force of the clip member uniformly over the panel and the conductor member 20. The force spreading member 40 may be simply a thin piece of a spongy, rubber material or some other suitable material which is compressible and resilient so that it will help spread the contact engaging force of the clip 30 on the electrical contacts. A silicone rubber may typically be used. It has been discovered that for the high voltage electrical contacts of a plasma display panel, an absolutely perfect connection is not as critical as a perfect connection would be for other electrical needs. For example, the high voltage pulses driving a plasma display panel will allow for a contact resistance ranging from negligible values up to, for example, 100 ohms of resistance in the contacts. This allows for a conductor system in the connection area which need not be electrically perfect as it would have to be for the logical elements of a computer, for example.

Referring now to FIG. 4, the enlarged perspective view shows a substrate 50 of a display panel having etched grooves 52 for the conductor system of the panel and forming conductor pathways. In the bottom of each groove is a small amount of conductor material 54 which provides the connection of electrical current to the interior operating portion of the panel. A conductor medium 60, according to the present invention, which may be a flexible member as previously described in connection with FIG. 1, or a portion of a large scale integrated circuit chip as will be described further on, has electrical members 62 on a surface thereof and projecting therefrom. These conductor elements may, for example, be of a narrower width or diameter than the width of the etched pathways 52 in the display panel substrate 50. This allows for electrical contact and mating of the conductor elements but does not cause any interference in the fit or connection process as no frictional resistance is required for engaging these contact elements. What is important, however, is that the conductor elements provide for a matching or keying engagement which provides for a connection between the display panel and the conductor device in a secure fashion which may be readily detected by a worker putting the connection system together.

A worker can easily detect alignment of the parts by attempting to slide the flexible conductor device 60 in a direction at right angles to the conductors. Perfect alignment is detected when the electrical members 62 "lock-in" to the etched pathways 52 and the flexible conductor device 60 does not easily slide.

As shown in FIGS. 5 and 6, a substrate 80 in each case has a plurality of depressed conductor pathways 82 each with a conductor 84 in the bottom thereof. In association with this is a conductor element 86 having conductor devices 88 projecting therefrom. As can be seen from the Figures, both the conductor elements 84 on the substrate 80 and the conductor elements on the conductor medium 86 are grouped. FIG. 5 illustrates the keying effect by showing that proper alignment allows for all of the projecting conductors on the conductor element 86 to properly engage in a secure side to side fashion with the substrate 80 while in FIG. 6 no proper engagement occurs because of the misalignment of the conductor groups.

Figure 7:
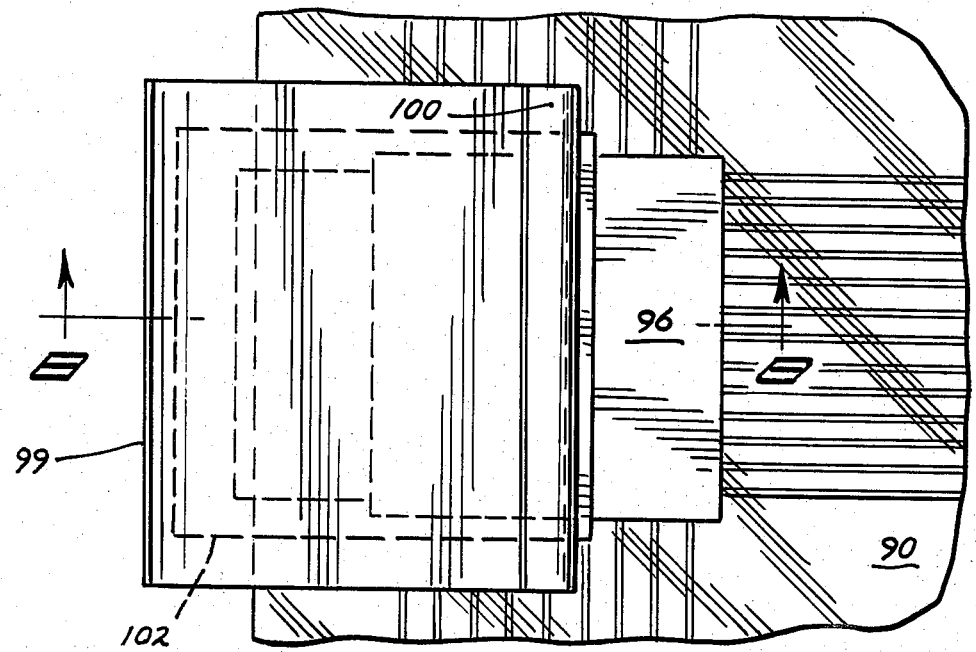
Figure 8:
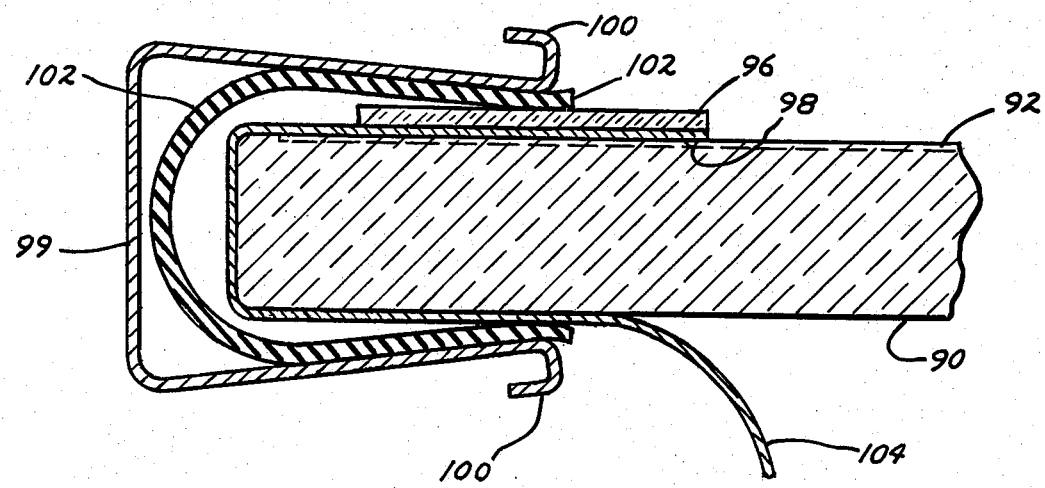

Referring now to FIGS. 7 and 8, a substrate 90 of a plasma display panel is shown of the same sort as previously described having etched pathways 92 with conductors deposited in the bottom thereof. Shown in conjunction with this is a large scale integrated circuit chip carrier 96 shown diagramatically as a square, thin box. This chip carrier 96 can be provided with conductor elements 98 on the bottom thereof to engage with the conductor 94 of the display panel substrate 90, in the same fashion as previously described in connection with the flexible member. The similar type of clip as shown before and having the same U-shaped element 99 and flanges 100 for operation of the clip is provided. The entire chip carrier 96 is held within the clip 99 using a similar flexible member 102 to that used previously. A ribbon conductor 104 may be connected with the chip carrier 96 in a conventional fashion to provide low voltage logic signals to the chip carrier to control operation of the plasma display panel together with the high voltage power sources which are controlled and which actually operate the display panel. Thus, a comparatively small group of conductors is necessary in the ribbon conductor 104 to provide logic control to the chip carrier together with the high voltage power source and the chip carrier provides the required control for the multiplicity of individual conductors in the display panel. This system thus provides direct connection of the logic and control voltages to the plasma display panel without requiring any connection from a control source to the display panel or connection at the display panel of a conductor system other than that coming directly from the logic source. The provision of direct connection in this fashion by a secure arrangement of conductors which allows for no possibility of misalignment, thus will provide for an important advantage in assembly of a plasma display system.

Referring now to FIG. 4, some typical dimensions will be supplied by way of example and not as a limitation of the scope of invention. The conductors 62 on substrate 60 may be spaced apart 800 microns (0.8 mm) and each conductor may be approximately 200 microns in width. The conductors 62 should be raised from the surface of the substrate about 36 microns and generally in the range of 30–40 microns. The grooves 52 in substrate 50 may be about 300 microns in width. The conductor material 54 should fill the grooves 52 to within about 25 microns of the surface plane of substrate 50. Thus conductors 62 project from substrate 60 a greater distance than the depth in the grooves required to reach the conductors. Since conductors 62 are deeper and narrower than the grooves, ease of mating contact is ensured.

What we claim is:

1. In combination, a gas discharge display panel having a pair of glass substrates assembled to form a thin gas discharge display chamber, wherein each of said substrates has a plurality of electrical conductors extending in a parallel fashion and said substrates are assembled with said conductors in an orthogonal relationship to define gas discharge display areas and each substrate has conductor connection means extending from the discharge display chamber at edges thereof consisting of depressed conductor pathways etched in the substrate having the conductor element deposited in the bottom thereof at a location exterior to the discharge display chamber, said conductors typically spaced apart 0.8 mm and 0.2 mm in width, and wherein said exterior conductors are electrically and physically continuous extensions of said conductors defining the gas discharge display areas, and a system for the connection of said gas plasma display panel to electrical signals which comprises:

a conductor means having multiple conductors supported by an insulating medium and terminating in raised conductor elements which correspond in spacing to the spacing of the depressed conductors on said substrate, for carrying electrical signals;

clip members having a U-shaped portion with clip contact areas on the inside of the legs of the U-shaped portion and with a pair of flanges, one at the end of each leg of the U-shaped portion, each flange having an engaging portion parallel to and spaced apart from the associated leg of the U-shaped portion and a connecting portion for connecting said mating portion to the leg of said U-shaped portion, said flanges adapted for engaging with a spreading tool at said engaging portion thereof, for securing said conductor means in position by the application of spring forces on said conductor means and on said substrates, and flexible force spreading means placed between said clip contact areas and said conductor means and said substrate to spread the force of application of said clip on connecting conductors from said conductor means and said panel.

2. The invention of claim 1 wherein said conductor elements on said conductor means and said conductor in said substrate are arranged in a keyed fashion so that electrical mating of conductors can only occur in a properly aligned conductor fashion.

3. The invention of claim 1 wherein said conductor elements consists of metal contact surfaces arranged on a bottom surface of a large scale integrated circuit chip.

4. The invention of claim 1 wherein said conductor elements are raised a distance greater than the distance from said substrate to the conductor surface in the depressed pathways.

* * * * *